United States Patent
Lapede et al.

(10) Patent No.: US 11,212,803 B2
(45) Date of Patent: Dec. 28, 2021

(54) SYNCHRONIZED SWITCHING OF WIRELESS PLATFORMS

(71) Applicant: Apple Inc., Cupertino, CA (US)

(72) Inventors: Adam B. Lapede, Los Altos, CA (US); Daniel R. Borges, San Francisco, CA (US); Mohammed W. Mokhtar, San Jose, CA (US); Helena D. O'Shea, San Jose, CA (US); Alon Paycher, Beit Hananya (IL); Oren Shani, Saratoga, CA (US); Matthew L. Semersky, San Jose, CA (US); Sriram Hariharan, Los Altos, CA (US); Sreeraman Anantharaman, Los Altos, CA (US); Khaye Loon Wei, San Francisco, CA (US); Andrew D. Smart, San Jose, CA (US)

(73) Assignee: Apple Inc., Cupertino, CA (US)

( * ) Notice: Subject to any disclaimer, the term of this patent is extended or adjusted under 35 U.S.C. 154(b) by 102 days.

(21) Appl. No.: 16/814,512

(22) Filed: Mar. 10, 2020

(65) Prior Publication Data
US 2021/0289498 A1 Sep. 16, 2021

(51) Int. Cl.
| | |
|---|---|
| *H04W 72/04* | (2009.01) |
| *H04W 36/06* | (2009.01) |
| *H04B 10/516* | (2013.01) |
| *H04L 1/00* | (2006.01) |
| *H03H 21/00* | (2006.01) |

(52) U.S. Cl.
CPC .... *H04W 72/0453* (2013.01); *H03H 21/0027* (2013.01); *H04B 10/5165* (2013.01); *H04L 1/0026* (2013.01); *H04W 36/06* (2013.01)

(58) Field of Classification Search
CPC .............. H04W 72/0453; H04W 36/06; H04L 1/0026; H04B 10/5165; H03H 21/0027
See application file for complete search history.

(56) References Cited

U.S. PATENT DOCUMENTS

| | | | | |
|---|---|---|---|---|
| 2004/0218562 | A1* | 11/2004 | Orava | H04W 72/02 370/329 |
| 2006/0205363 | A1* | 9/2006 | Godfrey | H04W 88/06 455/83 |

* cited by examiner

*Primary Examiner* — Steven H Nguyen
(74) *Attorney, Agent, or Firm* — Sterne, Kessler, Goldstein & Fox P.L.L.C.

(57) ABSTRACT

Disclosed herein are system, method, and computer program product embodiments for synchronizing the switching of different wireless platforms to different portions of a frequency band. An embodiment, at a first wireless platform, operates by receiving a band switch request message from a second wireless platform, wherein the band switch request message comprises a band switch delay period for the second wireless platform. The embodiment calculates a band switch time based on a band switch delay period for the first wireless platform and the band switch delay period for the second wireless platform. The embodiment transmits a band switch accept message comprising the band switch time to the second wireless platform. The embodiment sets a first filter to operate on a second portion of the frequency band based on the band switch time. The embodiment then operates on the second portion of the frequency band.

21 Claims, 6 Drawing Sheets

SYNCHRONIZED SWITCHING OF WIRELESS PLATFORMS

BACKGROUND

Technical Field

This disclosure relates to the field of wireless communications, including synchronizing the switching of two wireless platforms operating on different portions of a frequency band.

Background

A station (e.g., a laptop, mobile phone, tablet, or other electronic device) can include multiple wireless platforms each operating according to a different wireless protocol (e.g., Institute of Electrical and Electronics Engineers (IEEE) 802.11, Bluetooth, Long-Term Evolution (LTE), or New Radio (NR)). The station may want to simultaneously operate each of its wireless platforms in a given frequency band (e.g., the 2.4 GHz, 5 GHz, or 6 GHz frequency bands). The station can simultaneously operate each of its wireless platforms in a given frequency band by assigning each wireless platform to a different portion of the frequency band. But a wireless platform may want to leave its initially assigned portion of the frequency band and switch to a different portion of the frequency band. This is because switching to the different portion of the frequency band may lead to better transmission performance for the wireless platform. The wireless platform may further want to transition to a different portion of the frequency band occupied by another wireless platform. Finally, the wireless platform may want to perform this transition in real-time. This is because decreasing the transition time allows an end user to continue with transmissions more quickly which improves their user experience.

But, there can be several technological challenges associated with synchronizing the switching of different wireless platforms to different portions of the frequency band in real-time. First, the switching can cause data loss at one or both of the wireless platforms. Second, the switching can result in an unnecessary pause in transmitting or receiving data at one or both of the wireless platforms. Finally, the switching may be unreliable because of delays in exchanging synchronization messages through the station's host operating system.

SUMMARY

Disclosed herein are system, method, and computer program product embodiments for synchronizing the switching of different wireless platforms to different portions of a frequency band.

In some embodiments, a first wireless platform operates according to a first wireless protocol on a first portion of a frequency band, and a second wireless platform operates according to a second wireless protocol on a second portion of the frequency band. The wireless protocol can be Institute of Electrical and Electronics Engineers (IEEE) 802.11, Bluetooth, Long-Term Evolution (LTE), New Radio (NR). or various other wireless protocols as would be appreciated by a person of ordinary skill in the art. The frequency band can the 2.4 GHz frequency band, the 5 GHz frequency band, the 6 GHz frequency band, or various other frequency bands would be appreciated by a person of ordinary skill in the art.

A controller at the first wireless platform can optionally receive a channel quality information message from the second wireless platform. The controller at the first wireless platform can continuously receive channel quality information messages from the second wireless platform. The controller at the first wireless platform can also receive one or more other channel quality information messages from other wireless platforms. The controller can then receive a band switch request message from the second wireless platform. The band switch request message can indicate that the second wireless platform wants to operate on the same first portion of the frequency band that the first wireless platform is already operating on. The band switch request message can comprise a band switch delay period for the second wireless platform. The controller can then determine whether to accept the second wireless platform's band switch request message. For example, the controller can determine whether to accept the second wireless platform's band switch request message based on the one or more channel quality information messages. Based on the acceptance of the band switch request message, the controller can then calculate a band switch time based on a band switch delay period for the first wireless platform and the band switch delay period for the second wireless platform. The band switch time can represent a minimum amount of time before either the first wireless platform or the second wireless platform can switch to a different portion of the frequency band. The controller can then transmit a band switch accept message comprising the band switch time to the second wireless platform. If necessary, the controller can then set a filter of the first wireless platform to operate on the second portion of the frequency band based on the band switch time. The controller can then operate on the second portion of the frequency band. Finally, the controller can transmit a band switch complete message to the second wireless platform to indicate that it completed its switch to the second portion of the frequency band.

In some other embodiments, a first wireless platform operates according to a first wireless protocol on a first portion of a frequency band, and a second wireless platform operates according to a second wireless protocol on a second portion of the frequency band. The wireless protocol can be IEEE 802.11, Bluetooth, LTE, NR, or various other wireless protocols as would be appreciated by a person of ordinary skill in the art. The frequency band can the 2.4 GHz frequency band, the 5 GHz frequency band, the 6 GHz frequency band, or various other frequency bands would be appreciated by a person of ordinary skill in the art.

A controller at the first wireless platform can determine that operating on the first portion of the frequency band is undesirable. For example, the controller can determine that there is interference on the first portion of the frequency band. The controller can then optionally transmit a channel quality information message to the second wireless platform. The controller can then transmit a band switch request message to the second wireless platform. The band switch request message can indicate that the first wireless platform wants to operate on the same second portion of the frequency band that the second wireless platform is already operating on. The band switch request message can comprise a band switch delay period for the first wireless platform. The controller can then receive a band switch accept message from the second wireless platform. The band switch accept message can include an indication that the second wireless platform accepts the first wireless platform's request to operate on the second portion of the frequency band that the second wireless platform is already operating on. The band switch accept message can also include a band switch time. The band switch time can represent a minimum amount of time before either the first wireless platform or the second wireless platform can switch to a different portion of the frequency band.

In response to receiving the band switch accept message, the controller can transmit one or more requests to one or more other wireless platforms to influence which portions of the frequency band (or other frequency bands) they operate on. For example, in response to receiving the band switch accept message, the controller can request the one or more other wireless platforms to avoid operating in a particular portion of the frequency band to avoid interference. The controller can be configured to influence which portions of the frequency band (or other frequency bands) that the one or more other wireless platforms operate on based on set of policy preferences such as, but not limited to, a criticality of a service running at the first wireless platform.

The controller can then receive a band switch complete message from the second wireless platform. The band switch complete message can indicate that the second wireless platform completed its switch to the first portion of the frequency band. The controller can then set a filter of the first wireless platform to operate on the second portion of the frequency band based on the band switch time. The controller can then operate on the second portion of the frequency band.

Other features of the present disclosure will be apparent from the accompanying drawings and from the detailed description.

BRIEF DESCRIPTION OF THE DRAWINGS

The accompanying drawings are incorporated herein and form a part of the specification.

In the drawings, like reference numbers generally indicate identical or similar elements. Additionally, generally, the left-most digit(s) of a reference number identifies the drawing in which the reference number first appears.

DETAILED DESCRIPTION

Figure 1:
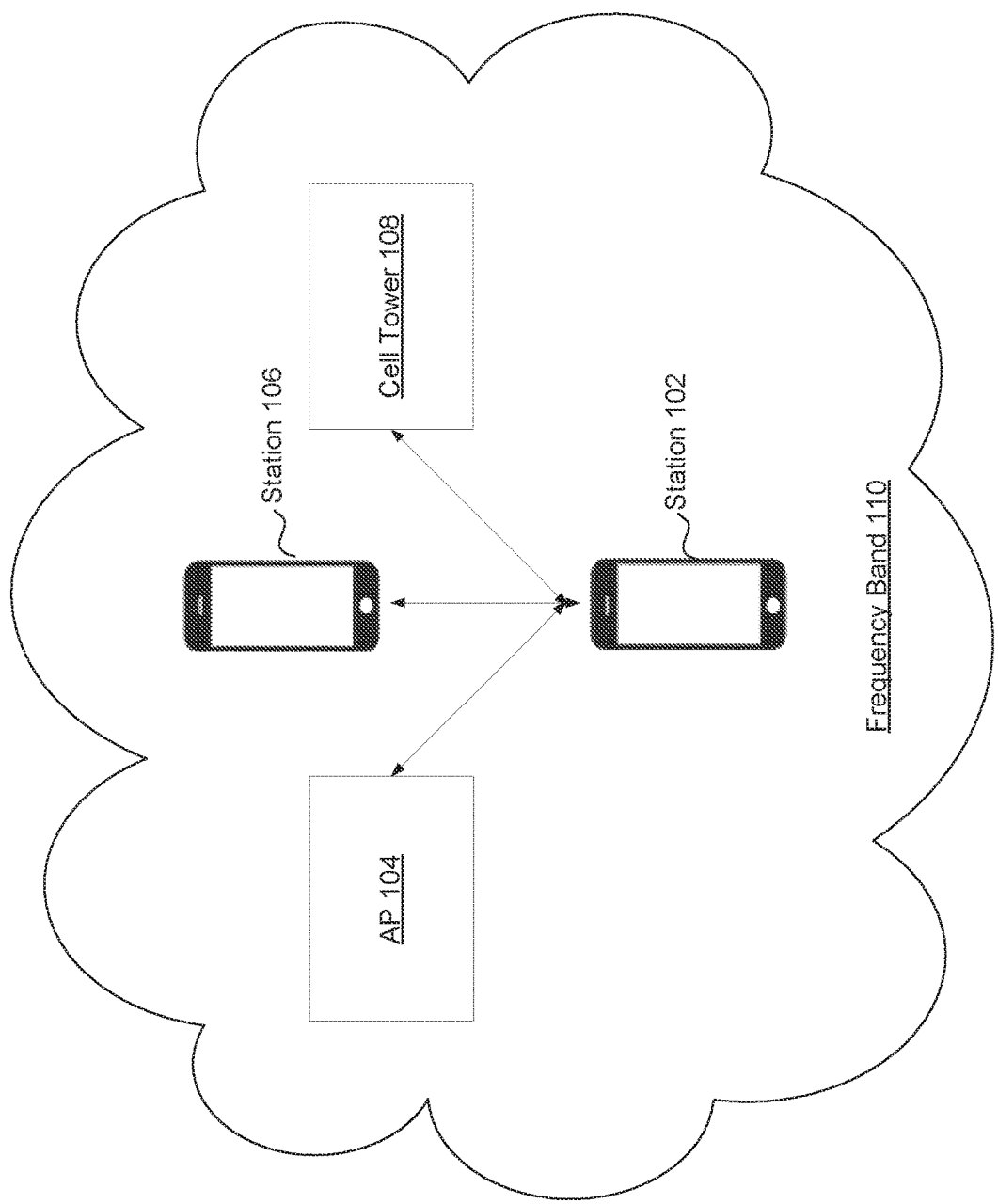
FIG. 1 is a block diagram of an example environment in which a station simultaneously operates each of its wireless platforms in a given frequency band, according to some embodiments.

Provided herein are system, apparatus, device, method and/or computer program product embodiments, and/or combinations and sub-combinations thereof, for synchronizing the switching of different wireless platforms to different portions of a frequency band in real-time.

A station (e.g., a laptop, mobile phone, tablet, or other electronic device) can include multiple wireless platforms each operating according to a different wireless protocol (e.g., Institute of Electrical and Electronics Engineers (IEEE) 802.11, Bluetooth, Long-Term Evolution (LTE). New Radio (NR), or various other wireless protocols as would be appreciated by a person of ordinary skill in the art). The station may want to simultaneously operate each of its wireless platforms in a given frequency band (e.g., the 2.4 GHz, 5 GHz, 6 GHz, or various other frequency bands as would be appreciated by a person of ordinary skill in the art). The station can simultaneously operate each of its wireless platforms in a given frequency band by assigning each wireless platform to a different portion of the frequency band. For example, the station can set a filter for each wireless platform that excludes transmissions outside the corresponding wireless platform's portion of the frequency band. But a wireless platform may want to leave its initially assigned portion of the frequency band and switch to a different portion of the frequency band. This is because switching to the different portion of the frequency band may lead to better transmission performance for the wireless platform. The wireless platform may further want to transition to a different portion of the frequency band occupied by another wireless platform. Finally, the wireless platform may want to perform this transition in real-time. This is because decreasing the transition time allows an end user to continue with transmissions more quickly which improves their user experience.

But, there can be several technological challenges associated with synchronizing the switching of different wireless platforms to different portions of the frequency band in real-time. First, the switching can cause data loss at one or both of the wireless platforms. For example, a wireless platform operating according to the IEEE 802.11 standard on a portion of the frequency band may want to transition to another portion of the frequency band occupied by another wireless platform operating according to the Bluetooth standard. However, the IEEE 802.11 wireless platform may still be operating on its original portion of the frequency band when the Bluetooth wireless platform actually leaves its portion of the frequency band. This can cause data loss at both wireless platforms. For example, this can occur because the IEEE 802.11 wireless platform can have an associated hangover delay (e.g., the period of time from when the IEEE 802.11 wireless platform requested an access point (AP) to stop transmitting to it until the transmission is actually stopped). The Bluetooth wireless platform may need to know the IEEE 802.11 wireless platform's associated hangover delay to avoid interfering with data transmissions to and from the IEEE 802.11 wireless platform.

Second, the switching can result in an unnecessary pause in transmitting and or receiving data at one or both of the wireless platforms. This delay can often be several seconds. This is can significantly reduce transmission opportunities and decrease end user experience. For example, this delay can occur when a wireless platform is waiting for another wireless platform to perform cleanup functions (e.g., requesting an AP, or upper layer software, to stop transmitting to it) before it actually switches to the portion of the frequency band occupied by the other wireless platform. The wireless platform may not be able to transmit or receive data during this waiting period. This can reduce data transmission throughput. This can be unacceptable for latency intolerant applications.

Finally, the switching may be unreliable because of delays in exchanging synchronization messages through the station's host operating system. In other words, synchronizing through the station's processor (e.g., central processing unit (CPU)) can introduce a high and unpredictable delays. This can cause synchronization of the switching of different wireless platforms to different portions of the frequency band to fail.

Provided herein are systems and methods for solving these technological challenges. Some embodiments herein involve directly exchanging synchronization messages between two wireless platforms (e.g., in a station of two or more wireless platforms) to coordinate the real-time switching of the two wireless platforms on different portions of a frequency band. This can avoid the high and unpredictable delays associated with synchronizing through a station's host operating system. One of the wireless platforms can calculate a band switch time based on band switch delay periods of both wireless platforms. Both wireless platforms can then use the band switch time to actually switch to their new portions of the frequency band. Because the two wireless platforms directly exchange the synchronization messages, and the band switch time accounts for the band switch delay periods of both wireless platforms, the switch can be performed with minimal data loss. In addition, the switch can be performed with minimal pausing in transmitting or receiving data at both wireless platforms. As would be appreciated by a person of ordinary skill, a station having more than two wireless platforms can coordinate real-time switching of the more than two wireless platforms across different portions of a frequency band by having different pairs of the more than two wireless platforms intercommunicate according to the embodiments herein.

FIG. 1 is a block diagram of an example environment 100 in which a station simultaneously operates each of its wireless platforms in a given frequency band, according to some embodiments. Environment 100 can include station 102, access point (AP) 104, station 106, cell tower 108, and frequency band 110. It is to be appreciated that environment 100 may include other stations, APs, and cell towers in addition to or in place of the stations, APs, and cell towers illustrated in FIG. 1 without departing from the scope and spirit of this disclosure. It is to be appreciated that environment 100 may not include all the stations, APs, and cell towers illustrated in FIG. 1 without departing from the scope and spirit of this disclosure.

Station 102 can include, but is not limited to, a desktop computer, laptop, smartphone, tablet, touchpad, wearable electronic device, smart watch, or other electronic device. Station 102 can include multiple wireless platforms. A wireless platform can be one or more hardware and or software components that enable a station (e.g., station 102) to communicate with other devices according to a wireless protocol. Station 102 can simultaneously operate each of its wireless platforms in frequency band 110 to communicate with AP 104, station 106, and cell tower 108.

Frequency band 110 can be an interval in the frequency domain available for wireless communication. For example, frequency band 110 can be the 2.4 GHz frequency band or the 5 GHz frequency band. As would be appreciated by a person of ordinary skill in the art, frequency band 110 can be various other frequency bands.

Each wireless platform of station 102 can operate according to a different wireless protocol. For example, station 102 can communicate with AP 104 according to the IEEE 802.11 standard (current proposals and/or future versions). Station 102 can communicate with station 106 according to the Bluetooth standard (current proposals and/or future versions). Station 102 can communicate with cell tower 108 according to a cellular wireless protocol standard (e.g., Global System for Mobile Communications (GSM), Code Division Multiple Access (CDMA), Long-Term Evolution (LTE), NR, or various other cellular wireless protocol standards as would be appreciated by a person of ordinary skill in the art). As would be appreciated by a person of ordinary skill in the art, station 102 can include various other wireless platforms to communicate with various other devices, including, but limited to stations, APs, and cell towers.

To simultaneously operate each of its wireless platforms in frequency band 110, station 102 can have each wireless platform operate on a different portion of frequency band 110. For example, station 102 can have its IEEE 802.11 wireless platform operate on a low portion of frequency band 110 and its Bluetooth wireless platform operate on a high portion of frequency band 110.

Station 102 can configure each wireless platform to operate on a different portion of frequency band 110 by setting a filter associated with each wireless platform to remove signals outside its assigned portion of frequency band 110. The filter can be a low-pass filter or a high-pass filter. For example, when station 102 has its IEEE 802.11 wireless platform operating on a low portion of frequency band 110, station 102 can set a low-pass associated with the IEEE 802.11 wireless platform to pass signals with a frequency lower than the low portion of frequency band 110.

Figure 2:
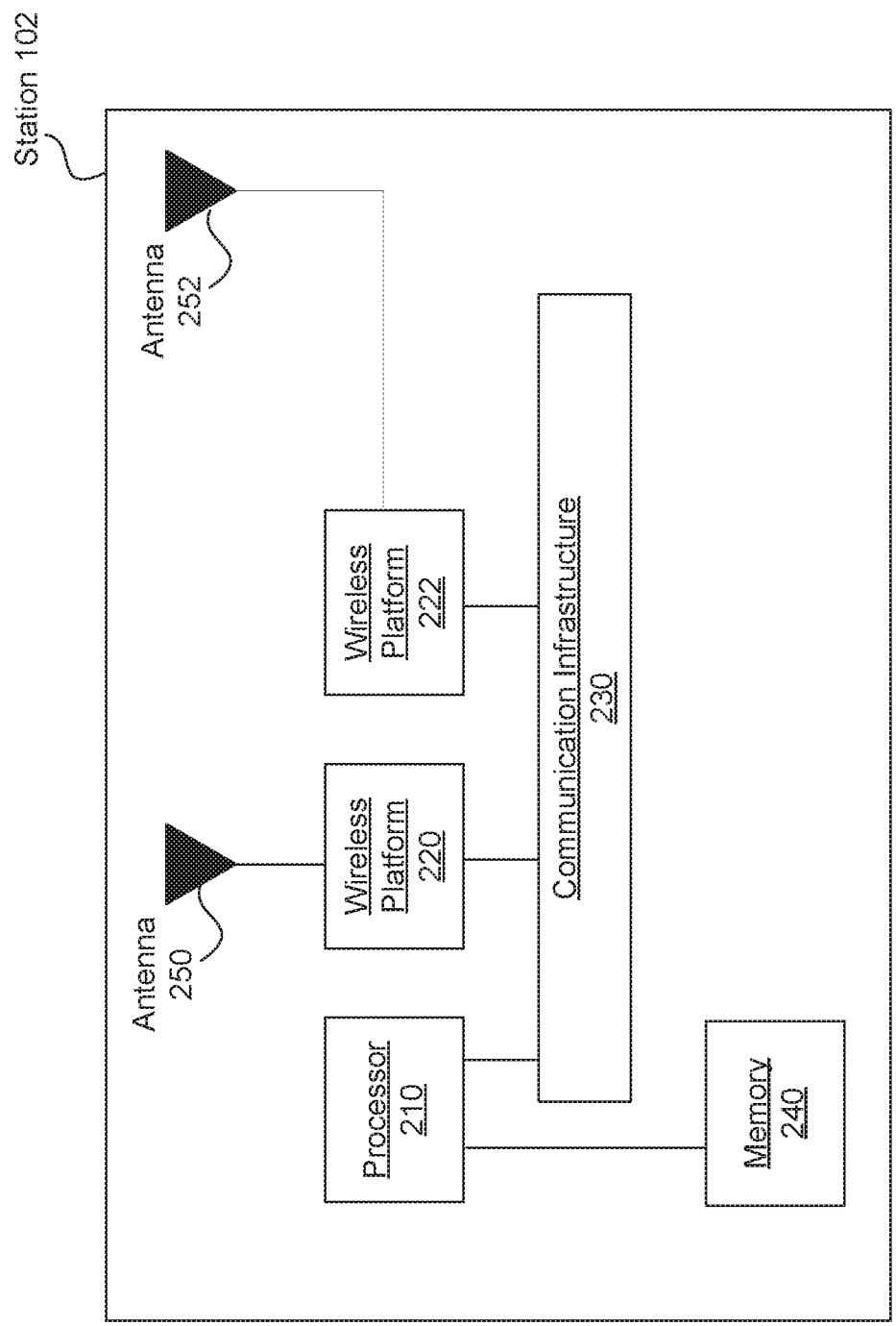
FIG. 2 illustrates a block diagram of an example station that simultaneously operates each of its wireless platforms in a given frequency band, according to some embodiments.

FIG. 2 illustrates a block diagram of station 102 that simultaneously operates each of its wireless platforms in a given frequency band, according to some embodiments. FIG. 2 is discussed with reference to FIG. 1. Station 102 includes processor 210, wireless platform 220, wireless platform 222, communication infrastructure 230, memory 240, antenna 250, and antenna 252. Memory 240 may include random access memory (RAM) and/or cache, and may include control logic (e.g., computer software) and/or data. Processor 210 together with instructions stored in memory 240 (or hard-wired in processor 210) can perform operations that help synchronize the switching of wireless platform 220 and wireless platform 222 to different portions of a frequency band in real-time. Processor 210 together with instructions stored in memory 240 (or hard-wired in processor 210) can also perform operations that control the behavior of one or more wireless platforms (e.g., wireless platform 220 and wireless platform 222) based on a regulatory environment, the services they are using, or various other characteristics as would be appreciated by a person of ordinary skill in the art.

Wireless platform 220 can transmit and receive communications signals (e.g. wireless signals) via antenna 250. Antenna 250 may include one or more antennas that may be the same or different types. Wireless platform 220 can transmit and receive communications signals according to various wireless protocols (e.g., IEEE 802.11 standard (current proposals and/or future versions).

Wireless platform 222 can transmit and receive communications signals (e.g. wireless signals) via antenna 252. Antenna 252 may include one or more antennas that may be the same or different types. Wireless platform 222 can transmit and receive communications signals according to various wireless protocols (e.g., Bluetooth standard (current proposals and/or future versions).

Wireless platform 220 can exchange messages with wireless platform 222 over communication infrastructure 230, including messages that synchronize the switching of wireless platform 220 and wireless platform 222 to different portions of a frequency band, according to some embodiments. Communication infrastructure 230 may be a bus. For example, communication infrastructure 230 can be a bus such as, but not limited to, Peripheral Component Interconnect Express (PCI Express), Serial Peripheral Interface (SPI), Inter-IC Sound (I2S), Mobile Industry Processor Interface (MIPI) System Power Management Interface (SPMI), MIPI Inter-integrated Circuit (I2C), or Universal Serial Bus (USB). Communication infrastructure 230 can also be a wireless link.

Figure 3:
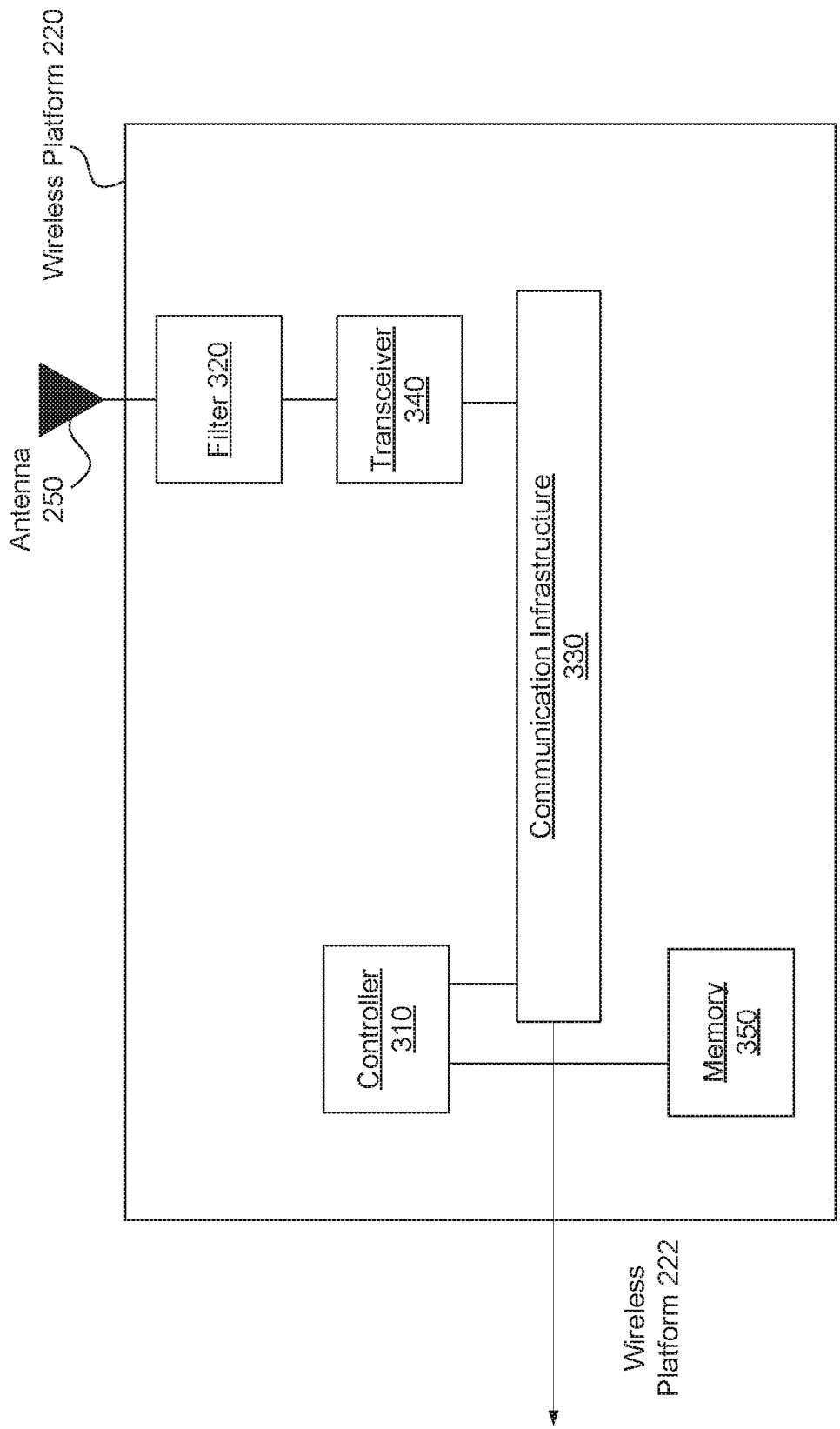
FIG. 3 illustrates a block diagram of an example wireless platform that exchanges messages with another wireless platform to synchronize the switching of it and the other wireless platform to different portions of a frequency band in real-time, according to some embodiments.

FIG. 3 illustrates a block diagram of wireless platform 220 that exchanges messages with wireless platform 222 to synchronize the switching of wireless platform 220 and wireless platform 222 to different portions of a frequency band in real-time, according to some embodiments. FIG. 3 is discussed with reference to FIGS. 1 and 2.

Wireless platform 220 includes controller 310, filter 320, communication infrastructure 330, transceiver 340, memory 350, antenna 250. Memory 350 may include random access memory (RAM) and/or cache, and may include control logic (e.g., computer software) and/or data. Controller 310 together with instructions stored in memory 350 (or hard-wired in controller 310) can perform operations that synchronize the switching of wireless platform 220 and wireless platform 222 to different portions of a frequency band in real-time. For example, controller 310 can exchange messages with wireless platform 222 over communication infrastructure 330 thereby synchronizing the switching of wireless platform 220 and wireless platform 222 to different portions of a frequency band in real-time. Communication infrastructure 330 can be a bus.

Controller 310 can also set filter 320 to enable wireless platform 220 to operate on a particular portion of a frequency band in real-time. For example, controller 310 can set filter 320 to be a low-pass filter to enable wireless platform 220 to operate on a low portion of a frequency band. Controller 310 can also set filter 320 to be a high-pass filter to enable wireless platform 220 to operate on a high portion of a frequency band. Controller 310 can set filter 320 to be a low-pass filter or a high-pass filter based on the exchange of messages between controller 310 and wireless platform 222 over communication infrastructure 330. As would be appreciated by a person of ordinary skill in the art, controller 310 can set filter 320 to select various other portions of a frequency band based on the exchange of messages between controller 310 and wireless platform 222 over communication infrastructure 330 to enable wireless platform 220 to operate on that portion of the frequency band.

Figure 4:
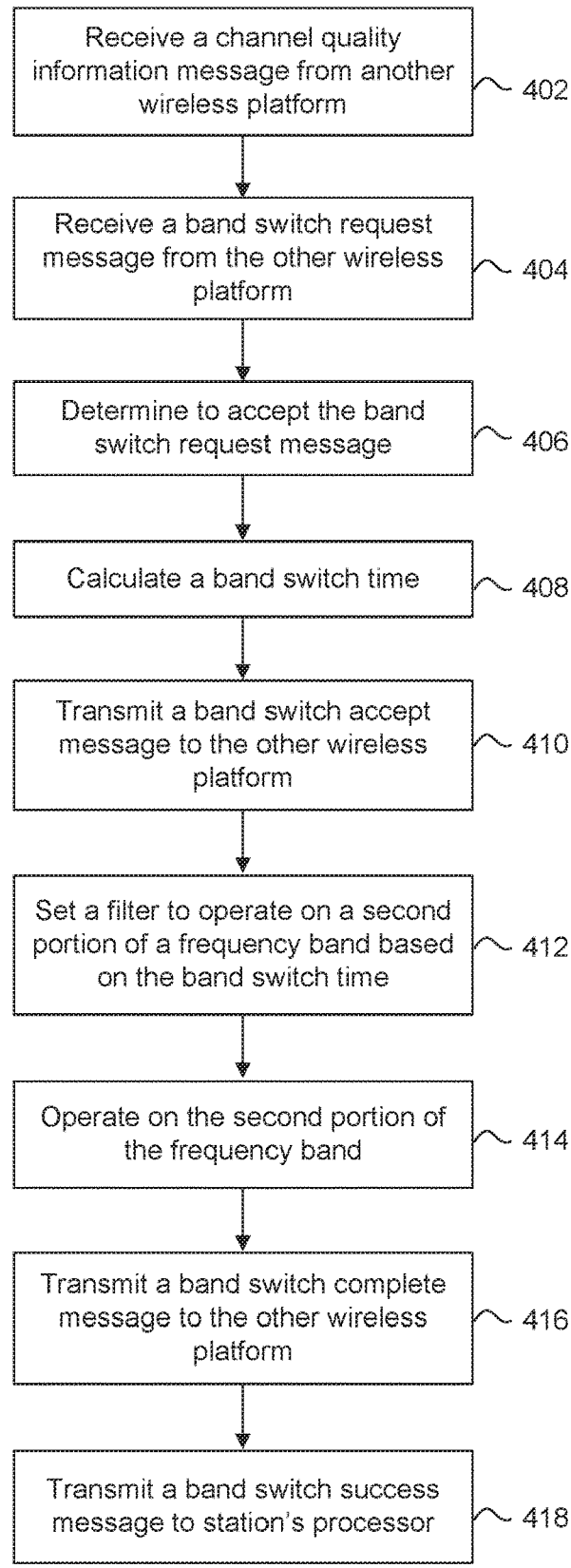
FIG. 4 is a flowchart illustrating a process for synchronizing the switching of different wireless platforms to different portions of a frequency band in real-time, according to some embodiments.

FIG. 4 is a flowchart for a method 400 for synchronizing the switching of different wireless platforms to different portions of a frequency band in real-time, according to an embodiment. Method 400 can be performed by processing logic that can comprise hardware (e.g., circuitry, dedicated logic, programmable logic, microcode, etc.), software (e.g., instructions executing on a processing device), or a combination thereof. It is to be appreciated that not all steps may be needed to perform the disclosure provided herein. Further, some of the steps may be performed simultaneously, or in a different order than shown in FIG. 4, as will be understood by a person of ordinary skill in the art.

Method 400 shall be described with reference to FIGS. 1-3. However, method 400 is not limited to that example embodiment.

In method 400, wireless platform 220 operates according to a first wireless protocol on a first portion of a frequency band. For example, wireless platform 220 operates according to the Bluetooth wireless protocol on a high portion of the 5 GHz frequency band. As would be appreciated by a person of ordinary skill in the art, wireless platform 220 can operate according to various other wireless protocols on various other portions of various other frequency bands.

In method 400, wireless platform 222 operates according to a second wireless protocol on a second portion of the same frequency band as wireless platform 220. For example, wireless platform 222 operates according to the IEEE 802.11 wireless protocol on a low portion of the 5 GHz frequency band. As would be appreciated by a person of ordinary skill in the art, wireless platform 222 can operate according to various other wireless protocols on various other portions of various other frequency bands.

In 402, controller 310 of wireless platform 220 can optionally receive a channel quality information message from wireless platform 222. For example, controller 310 can receive the channel quality information message over communications infrastructure 330. The channel quality information message can include channel quality indicators such amount of interference, signal strength, link quality, transmission speed. As would be appreciated by a person of ordinary skill in the art, the channel quality information message can include various other types of channel quality indicators.

In 404, controller 310 receives a band switch request message from wireless platform 222. For example, controller 310 of wireless platform 220 can receive the band switch request message over communications infrastructure 330. The band switch request message can indicate that wireless platform 222 wants to operate on the same first portion of the frequency band that wireless platform 220 is already operating on. The band switch request message can include an indication that wireless platform 222 intends to operate on the first portion of the frequency band.

The band switch request message can include a band switch delay period for wireless platform 222. The band switch delay period for wireless platform 222 can be an amount of time that wireless platform 222 needs before it stops operating on the second portion of the frequency band. For example, if wireless platform 222 operates according to the IEEE 802.11 wireless protocol, the band switch delay period for wireless platform 222 can include a hangover time. The hangover time can represent an amount of time between wireless platform 222 requesting an AP (e.g., AP 104) to stop communicating with it and wireless platform 222 actually disassociating itself from the AP. If wireless platform 222 operates according to the Bluetooth wireless protocol, the band switch delay period for wireless platform 222 can include an amount of time for wireless platform 222 to disassociate from its slave device. Thus, the band switch delay period for wireless platform 222 can indicate a minimum amount of time that wireless platform 220 should wait before actually switching to the second portion of the frequency band. As would be appreciated by a person of ordinary skill in the art, the band switch request message for wireless platform 222 can be implemented using various data structures.

In 406, controller 310 determines that it will accept the band switch request message of 404. For example, controller 310 can determine whether to allow wireless platform 222 to operate on wireless platform 220's portion of the frequency band (e.g., the first portion of the frequency band), as well as to switch wireless platform 220 to the portion of the frequency band that wireless platform 222 currently operates on (e.g., the second portion of the frequency band).

Controller 310 can determine whether to accept wireless platform 222's band switch request message based on the channel quality information message received in 402. For example, controller 310 can determine whether to accept wireless platform 222's band switch request message based on amount of interference associated with the portion of the frequency band that wireless platform 222 currently operates on (e.g., the second portion of the frequency band). The amount of interference can be stored in the channel quality information message. As would be appreciated by a person of ordinary skill in the art, controller 310 can determine whether to accept wireless platform 222's band switch request message based on various other channel quality indicators stored in the channel quality information message.

In some embodiments, controller 310 can notify processor 210 of wireless platform 222's intention to operate on the first portion of the frequency band. This can allow processor 210 to coordinate a higher level policy between all the wireless platforms in the system (e.g., wireless platform 220 and wireless platform 222). For example, processor 210 can decide to override wireless platform 220's determination to accept wireless platform 222's band switch request message. Processor 210 can also request another wireless platform to stop operating on a portion of the frequency band that is currently in use due to radio frequency (RF) interference. Because processor 210 is aware of where all the active wireless platforms are operating, processor 210 can coordinate how they operate across the frequency band.

In some embodiments, if controller 310 determines not to accept wireless platform 222's band switch request message, controller 310 can transmit a band switch reject message to wireless platform 222. The band switch reject message can include an indication that wireless platform 220 does not intend to allow wireless platform 222 to operate on the portion of the frequency band that wireless platform 220 currently operates on (e.g., the first portion of the frequency band).

In 408, controller 310 calculates a band switch time for wireless platform 220 and wireless platform 222. The band switch time can represent a minimum amount of time before either wireless platform 220 or wireless platform 222 can switch to a different portion of the frequency band. Controller 310 can calculate the band switch time based on a band switch delay period for wireless platform 220 and the band switch delay period for wireless platform 222 received in 404. For example, controller 310 can calculate the band switch time by selecting a greater of the band switch delay period for wireless platform 220 and the band switch delay period for wireless platform 222.

The band switch delay period for wireless platform 220 can be an amount of time that wireless platform 220 needs before it stops operating on the first portion of the frequency band. For example, if wireless platform 220 operates according to the Bluetooth wireless protocol, the band switch delay period for wireless platform 220 can include an amount of time for wireless platform 220 disassociate itself from a slave device.

In 410, controller 310 transmits a band switch accept message to wireless platform 222 based on the determination to accept wireless platform 222's band switch request message in 406. For example, controller 310 can transmit the band switch accept message over communications infrastructure 330. The band switch accept message can indicate that wireless platform 220 accepts wireless platform 222's request to operate on the first portion of the frequency band that wireless platform 220 is already operating on. The band switch accept message can include an indication that wireless platform 220 accepts wireless platform 222's request to operate on the first portion of the frequency band that wireless platform 220 is already operating on.

The band switch accept message can also include the band switch time calculated in 406. Wireless platform 222 can use the band switch time to synchronize the switching of wireless platform 222 to the first portion of the frequency band and wireless platform 220 to the second portion of the frequency band. This can reduce inadvertent transmissions over the same portion of the frequency band, thereby reducing data loss. This can also reduce pauses in transmitting thereby improving data throughput during the switching.

In 412, controller 310 sets filter 320 to operate on the second portion of the frequency band based on the band switch time. This can enable wireless platform 220 to operate on the second portion of the frequency band. Controller 310 can set filter 320 to operate on the second portion of the frequency band after an occurrence of the band switch time. This can ensure that controller 310 does not inadvertently filter out one or more remaining transmissions received over the first portion of the frequency band. Moreover, wireless platform 220 can continue to operate on the first portion of the frequency until the occurrence of the band switch time. This can reduce pauses in transmitting thereby improving data throughput during switching.

Controller 310 can set filter 320 based on a position of the second portion of the frequency band in the frequency band. For example, controller 310 can set filter 320 to be a low-pass filter when the second portion of the frequency band exists in the lower portion of the frequency band. Controller 310 can set filter 320 to be a high-pass filter when the second portion of the frequency band exists in the higher portion of the frequency band.

In 414, controller 310 operates on the second portion of the frequency band in response to filter 320 being set in 412. Controller 310 can operate on the second portion of the frequency band by establishing a connection with another device on the second portion of the frequency band. For example, controller 310 can establish a connection with a Bluetooth slave device (e.g., station 106). Controller 310 can also establish an association with an AP (e.g., AP 104).

In 416, controller 310 transmits a band switch complete message to wireless platform 222. For example, controller 310 can transmit the band switch complete message over communications infrastructure 330. The band switch complete message can indicate that wireless platform 220 completed its switch to the second portion of the frequency band. Thus, wireless platform 222 can proceed with its switch to the first portion of the frequency band. The band switch complete message can ensure that wireless platform 222 proceeds with its switch to the first portion of the frequency band with the knowledge that wireless platform 220 is no longer operating on the first portion of the frequency band.

In 418, controller 310 can transmit a band switch success message to processor 210. This can indicate to processor 210 that the switch has been completed, and thereby alerting station's 102 host operating system.

Figure 5:
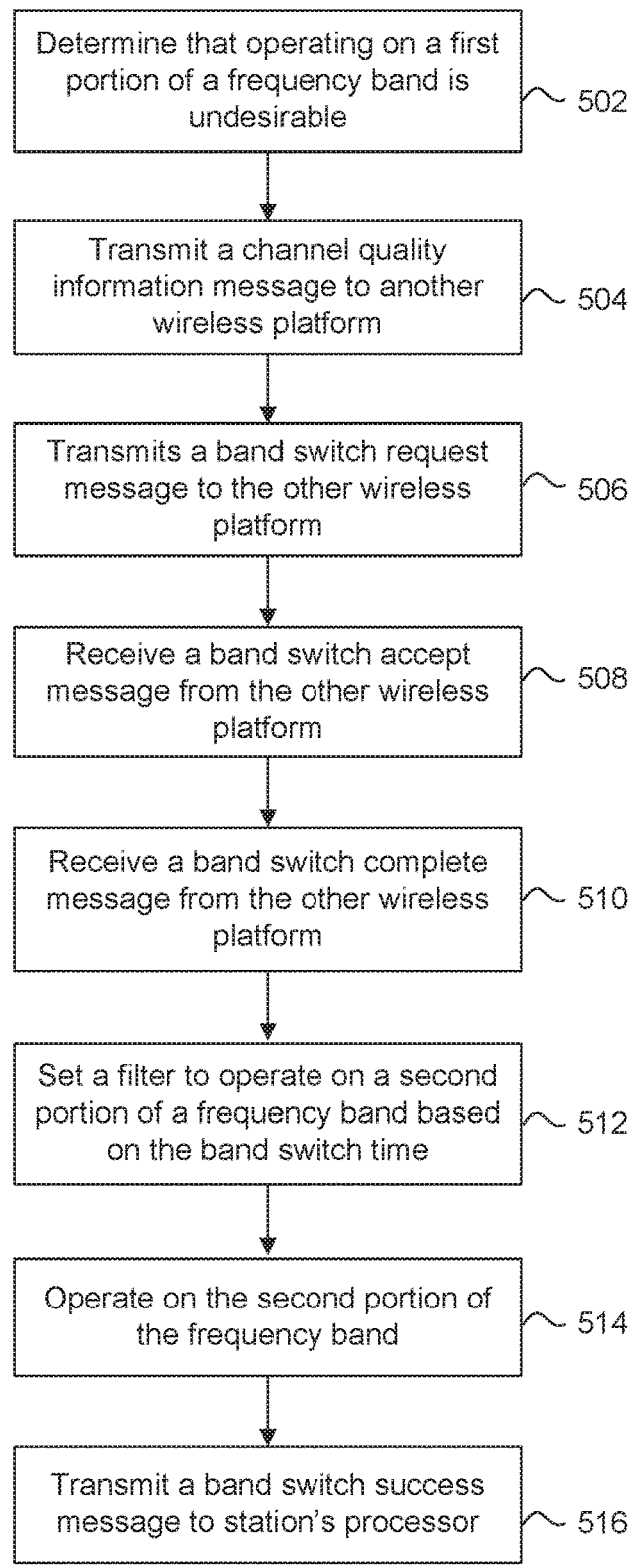
FIG. 5 is a flowchart illustrating a process for synchronizing the switching of different wireless platforms to different portions of a frequency band in real-time, according to some embodiments.

FIG. 5 is a flowchart for a method 500 for synchronizing the switching of different wireless platforms to different portions of a frequency band in real-time, according to an embodiment. Method 500 can be performed by processing logic that can comprise hardware (e.g., circuitry, dedicated logic, programmable logic, microcode, etc.), software (e.g., instructions executing on a processing device), or a combination thereof. It is to be appreciated that not all steps may be needed to perform the disclosure provided herein. Further, some of the steps may be performed simultaneously, or in a different order than shown in FIG. 5, as will be understood by a person of ordinary skill in the art.

Method 500 shall be described with reference to FIGS. 1-3. However, method 500 is not limited to that example embodiment.

In method 500, wireless platform 220 operates according to a first wireless protocol on a first portion of a frequency band. For example, wireless platform 220 operates according to the IEEE 802.11 wireless protocol on a low portion of the 5 GHz frequency band. As would be appreciated by a person of ordinary skill in the art, wireless platform 220 can operate according to various other wireless protocols on various other portions of various other frequency bands.

In method 500, wireless platform 222 operates according to a second wireless protocol on a second portion of the same frequency band as wireless platform 220. For example, wireless platform 222 operates according to the Bluetooth wireless protocol on a high portion of the 5 GHz frequency band. As would be appreciated by a person of ordinary skill in the art, wireless platform 222 can operate according to various other wireless protocols on various other portions of various other frequency bands.

In 502, controller 310 of wireless platform 220 determines that operating on the first portion of the frequency band is undesirable. For example, controller 310 can determine that there is interference on the first portion of the frequency band. Controller 310 can also determine an occurrence of a trigger that indicates that wireless platform 220 cannot continue to operate on the first portion of the frequency band. For example, the trigger can be station 102 moving away from an access point (e.g., AP 104).

In 504, controller 310 can optionally transmit a channel quality information message to wireless platform 222. For example, controller 310 can transmit the channel quality information over communications infrastructure 330. The channel quality information message can include channel quality indicators such amount of interference, signal strength, link quality, transmission speed, and service priority level. The service priority level can indicate to wireless platform 222 what priority level service is currently operating on wireless platform 220 to trigger wireless platform 222 to change to another spectrum area to cooperate with wireless platform 220. As would be appreciated by a person of ordinary skill in the art, the channel quality information message can include various other types of channel quality indicators.

In 506, controller 310 transmits a band switch request message to wireless platform 222. For example, controller 310 can transmit the band switch request message over communications infrastructure 330. The band switch request message can indicate that wireless platform 220 wants to operate on the same second portion of the frequency band that wireless platform 222 is already operating on. The band switch request message can include an indication that wireless platform 220 intends to operate on the second portion of the frequency band.

The band switch request message can include a band switch delay period for wireless platform 220. The band switch delay period for wireless platform 220 can be an amount of time that wireless platform 220 needs before it stops operating on the first portion of the frequency band. For example, if wireless platform 220 operates according to the IEEE 802.11 wireless protocol, the band switch delay period for wireless platform 220 can include a hangover time. The hangover time can represent an amount of time between wireless platform 220 requesting an AP (e.g., AP 104) to stop communicating with it and the wireless platform 220 actually disassociating itself from the AP. If wireless platform 220 operates according to the Bluetooth wireless protocol, the band switch delay period for wireless platform 220 can include an amount of time for wireless platform 220 to disassociate from its slave device. Thus, the band switch delay period for wireless platform 220 can indicate a minimum amount of time that wireless platform 220 should wait before actually switching to the second portion of the frequency band. As would be appreciated by a person of ordinary skill in the art, the band switch request message can be implemented using various data structures.

In 508, controller 310 receives a band switch accept message from wireless platform 222. For example, controller 310 can receive the band switch accept message over communications infrastructure 330. The band switch accept message can indicate that wireless platform 222 accepted wireless platform 220's request to operate on the second portion of the frequency band that wireless platform 222 is already operating on. The band switch accept message can include an indication that wireless platform 222 accepts wireless platform 220's request to operate on the second portion of the frequency band that wireless platform 222 is already operating on.

The band switch accept message can also include a band switch time. The band switch time can represent a minimum amount of time before either wireless platform 220 or wireless platform 222 can switch to a different portion of the frequency band. Controller 310 can use the band switch time to synchronize the switching of wireless platform 220 to the second portion of the frequency band and wireless platform 222 to the first portion of the frequency band. This can reduce inadvertent transmissions over the same portion of the frequency band, thereby reducing data loss. This can also reduce pauses in transmitting thereby improving data throughput during the switching.

In 510, controller 310 receives a band switch complete message from wireless platform 222. For example, controller 310 can receive the band switch complete message over communications infrastructure 330. The band switch complete message can indicate that wireless platform 222 completed its switch to the first portion of the frequency band. Thus, wireless platform 220 can proceed with its switch to the second portion of the frequency band. The band switch complete message can ensure that wireless platform 220 proceeds with its switch to the second portion of the frequency band with the knowledge that wireless platform 222 is actually no longer operating on the second portion of the frequency band.

In 512, controller 310 sets filter 320 to operate on the second portion of the frequency band based on the band switch time. This can enable wireless platform 220 to operate on the second portion of the frequency band. Controller 310 can set filter 320 to operate on the second portion of the frequency band after receipt of the band switch complete message in 508. This can ensure that controller 310 does not inadvertently filter out one or more remaining transmissions received over the first portion of the frequency band. Moreover, wireless platform 220 can continue to operate on the first portion of the frequency band until the occurrence of the band switch time. This can reduce pauses in transmitting thereby improving data throughput during the switching.

Controller 310 can set filter 320 based on a position of the second portion of the frequency band in the frequency band. For example, controller 310 can set filter 320 to be a low-pass filter when the second portion of the frequency band exists in the lower portion of the frequency band. Controller 310 can set filter 320 to be a high-pass filter when the second portion of the frequency band exists in the higher portion of the frequency band.

In 514, controller 310 operates on the second portion of the frequency band in response to filter 320 being set in 512. Controller 310 can operate on the second portion of the frequency band by establishing a connection with another device on the second portion of the frequency band. For example, controller 310 can establish a connection with a Bluetooth slave device (e.g., station 106). Controller 310 can also establish an association with an AP (e.g., AP 104).

In 516, controller 310 transmits a band switch success message to processor 210. This can indicate to processor 210 that the switch has been completed, and thereby alerting station's 102 host operating system.

Figure 6:
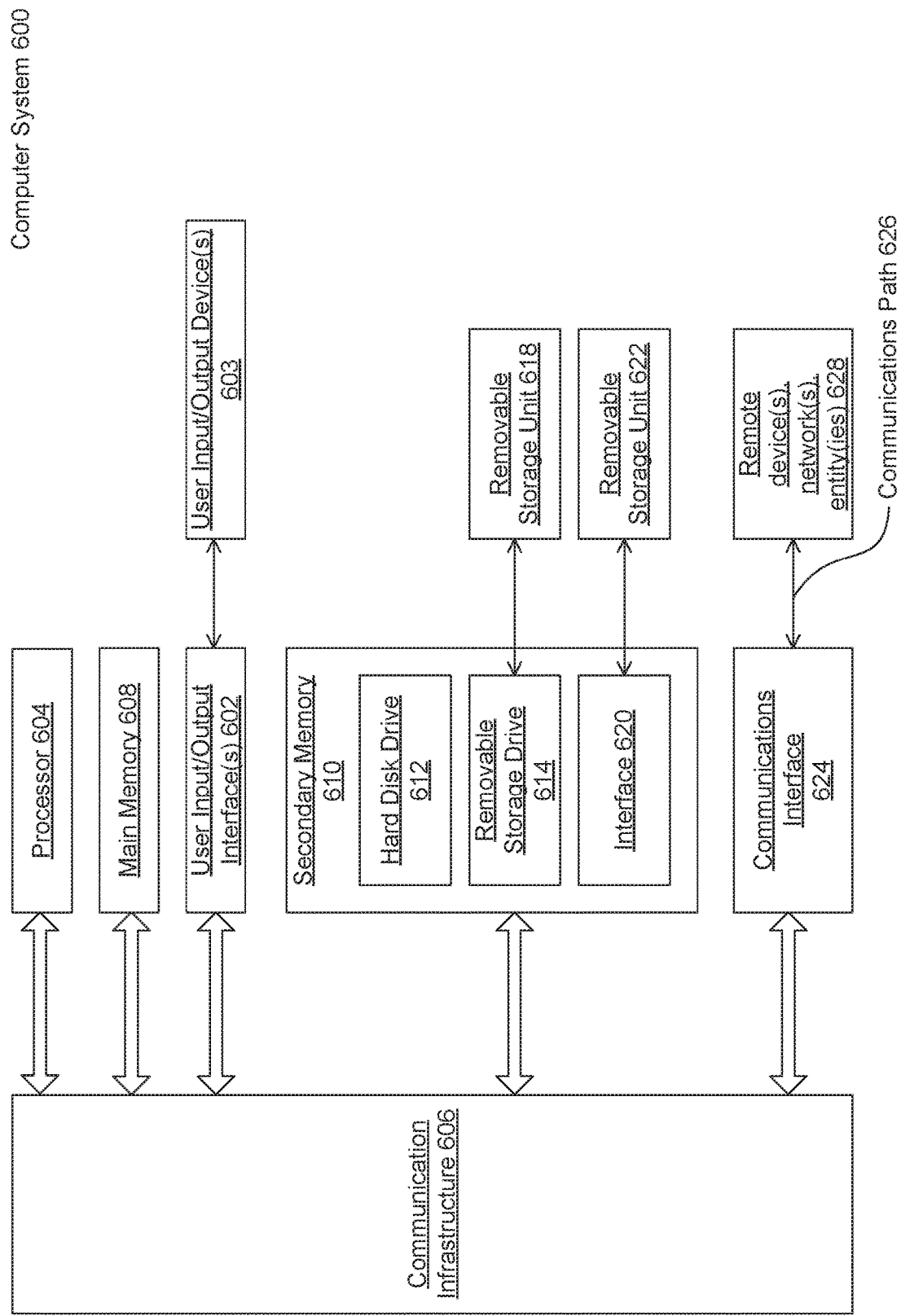
FIG. 6 is an example computer system useful for implementing various embodiments.

Various embodiments can be implemented, for example, using one or more computer systems, such as computer system 600 shown in FIG. 6. Computer system 600 can be used, for example, to implement method 400 of FIG. 4. Computer system 600 can be used, for example, to implement method 500 of FIG. 5. Computer system 600 can be any computer capable of performing the functions described herein.

Computer system 600 can be any well-known computer capable of performing the functions described herein.

Computer system 600 includes one or more processors (also called central processing units, or CPUs), such as a processor 604. Processor 604 is connected to a communication infrastructure or bus 606.

One or more processors 604 may each be a graphics processing unit (GPU). In an embodiment, a GPU is a processor that is a specialized electronic circuit designed to process mathematically intensive applications. The GPU may have a parallel structure that is efficient for parallel processing of large blocks of data, such as mathematically intensive data common to computer graphics applications, images, videos, etc.

Computer system 600 also includes user input/output device(s) 603, such as monitors, keyboards, pointing devices, etc., that communicate with communication infrastructure 606 through user input/output interface(s) 602.

Computer system 600 also includes a main or primary memory 608, such as random access memory (RAM). Main memory 608 may include one or more levels of cache. Main memory 608 has stored therein control logic (i.e., computer software) and/or data.

Computer system 600 may also include one or more secondary storage devices or memory 610. Secondary memory 610 may include, for example, a hard disk drive 612 and/or a removable storage device or drive 614. Removable storage drive 614 may be a floppy disk drive, a magnetic tape drive, a compact disk drive, an optical storage device, tape backup device, and/or any other storage device/drive.

Removable storage drive 614 may interact with a removable storage unit 618.

Removable storage unit 618 includes a computer usable or readable storage device having stored thereon computer software (control logic) and/or data. Removable storage unit 618 may be a floppy disk, magnetic tape, compact disk, DVD, optical storage disk, and/any other computer data storage device. Removable storage drive 614 reads from and/or writes to removable storage unit 618 in a well-known manner.

According to an exemplary embodiment, secondary memory 610 may include other means, instrumentalities or other approaches for allowing computer programs and/or other instructions and/or data to be accessed by computer system 600. Such means, instrumentalities or other approaches may include, for example, a removable storage unit 622 and an interface 620. Examples of the removable storage unit 622 and the interface 620 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 600 may further include a communication or network interface 624. Communication interface 624 enables computer system 600 to communicate and interact with any combination of remote devices, remote networks, remote entities, etc. (individually and collectively referenced by reference number 628). For example, communication interface 624 may allow computer system 600 to communicate with remote devices 628 over communications path 626, which may be wired and/or wireless, and which may include any combination of LANs, WANs, the Internet, etc. Control logic and/or data may be transmitted to and from computer system 600 via communication path 626.

In an embodiment, a tangible, non-transitory apparatus or article of manufacture comprising a tangible, non-transitory computer useable or readable medium having control logic (software) stored thereon is also referred to herein as a computer program product or program storage device. This includes, but is not limited to, computer system 600, main memory 608, secondary memory 610, and removable storage units 618 and 622, as well as tangible articles of manufacture embodying any combination of the foregoing. Such control logic, when executed by one or more data processing devices (such as computer system 600), causes such data processing devices to operate as described herein.

Based on the teachings contained in this disclosure, it will be apparent to persons skilled in the relevant art(s) how to make and use embodiments of this disclosure using data processing devices, computer systems and/or computer architectures other than that shown in FIG. 6. In particular, embodiments can operate with software, hardware, and/or operating system implementations other than those described herein.

It is to be appreciated that the Detailed Description section, and not any other section, is intended to be used to interpret the claims. Other sections can set forth one or more but not all exemplary embodiments as contemplated by the inventor(s), and thus, are not intended to limit this disclosure or the appended claims in any way.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments can perform functional blocks, steps, operations, methods, etc. using orderings different than those described herein.

References herein to "one embodiment," "an embodiment," "an example embodiment," or similar phrases, indicate that the embodiment described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments can be described using the expression "coupled" and "connected" along with their derivatives. These terms are not necessarily intended as synonyms for each other. For example, some embodiments can be described using the terms "connected" and/or "coupled" to indicate that two or more elements are in direct physical or electrical contact with each other. The term "coupled," however, can also mean that two or more elements are not in direct contact with each other, but yet still co-operate or interact with each other.

The breadth and scope of this disclosure should not be limited by any of the above-described exemplary embodiments, but should be defined only in accordance with the following claims and their equivalents.

What is claimed is:

1. A station, comprising:
   a first wireless platform, comprising a first controller and a first filter, and configured to operate according to a first wireless protocol on a first portion of a frequency band, and
   a second wireless platform, communicatively coupled to the first wireless platform, and configured to operate according to a second wireless protocol on a second portion of the frequency band;
   wherein the first controller is configured to:
     receive a band switch request message from the second wireless platform, wherein the band switch request message comprises an indication that the second wireless platform intends to operate on the first portion of the frequency band, and a band switch delay period for the second wireless platform;
     calculate a band switch time for the first wireless platform and the second wireless device based on a band switch delay period for the first wireless platform and the band switch delay period for the second wireless platform;
     transmit a band switch accept message to the second wireless platform, wherein the band switch accept message comprises the band switch time;
     set the first filter to operate on the second portion of the frequency band based on the band switch time; and
     operate the first wireless platform on the second portion of the frequency band in response to the first filter being set to operate on the second portion of the frequency band.

2. The station of claim 1, wherein the first controller is further configured to:
   operate the first wireless platform on the first portion of the frequency band until an occurrence of the band switch time.

3. The station of claim 1, wherein the first controller is further configured to:
   receive a channel quality information message from the second wireless platform, wherein the channel quality information message specifies channel quality information for the second portion of the frequency band; and
   wherein to transmit the band switch accept message to the second wireless platform the first controller is configured to transmit the band switch accept message to the second wireless platform based on the channel quality information message.

4. The station of claim 1, wherein to calculate the band switch time, the first controller is further configured to select a greater of the band switch delay period for the first wireless platform and the band switch delay period for the second wireless platform as the band switch time.

5. The station of claim 1, wherein to set the first filter to operate on the second portion of the frequency band, the first controller is further configured to:
   set the first filter to operate on the second portion of the frequency band after an occurrence of the band switch time.

6. The station of claim 1, wherein the second wireless platform comprises a second controller configured to:
   receive the band switch accept message; and
   operate the second wireless platform on the second portion of the frequency band until the band switch time.

7. The station of claim 1, wherein the first controller is further configured to:
   transmit a band switch complete message to the second wireless platform, wherein the band switch complete message indicates that the first wireless platform is operating on the second portion of the frequency band.

8. The station of claim 7, wherein the second wireless platform comprises a second controller and a second filter, and wherein the second controller is configured to:
   receive the band switch complete message;
   set the second filter to operate on the first portion of the frequency band based on the band switch complete message; and
   operate the second wireless platform on the first portion of the frequency band in response to the second filter being set to operate on the first portion of the frequency band.

9. A computer implemented method for switching a first wireless platform and a second wireless platform to different portions of a frequency band, comprising:
   receiving, by a first controller of the first wireless platform operating according to a first wireless protocol on a first portion of the frequency band, a band switch request message from the second wireless platform operating according to a second wireless protocol on a second portion of the frequency band, wherein the band switch request message comprises an indication that the second wireless platform intends to operate on the first portion of the frequency band, and a band switch delay period for the second wireless platform;
   calculating, by the first controller, a band switch time for the first wireless platform and the second wireless platform based on a band switch delay period for the first wireless platform and the band switch delay period for the second wireless platform;
   transmitting, by the first controller, a band switch accept message to the second wireless platform, wherein the band switch accept message comprises the band switch time;
   setting, by the first controller, a first filter of the first wireless platform to operate on the second portion of the frequency band based on the band switch time; and operating the first wireless platform, by the first controller, on the second portion of the frequency band in response to the first filter being set to operate on the second portion of the frequency band.

10. The computer implemented method of claim 9, further comprising:
operating the first wireless platform, by the first controller, on the first portion of the frequency band until an occurrence of the band switch time.

11. The computer implemented method of claim 9, further comprising:
receiving, by the first controller, a channel quality information message from the second wireless platform, wherein the channel quality information message specifies channel quality information for the second portion of the frequency band; and
wherein the transmitting the band switch accept message to the second wireless platform further comprises:
transmitting, by the first controller, the band switch accept message to the second wireless platform based on the channel quality information message.

12. The computer implemented method of claim 9, wherein the calculating the band switch time further comprises:
selecting, by the first controller, a greater of the band switch delay period for the first wireless platform and the band switch delay period for the second wireless platform as the band switch time.

13. The computer implemented method of claim 9, wherein the setting the first filter further comprises:
setting, by the first controller, the first filter to operate on the second portion of the frequency band after an occurrence of the band switch time.

14. The computer implemented method of claim 9, further comprising:
receiving, by a second controller of the second wireless platform, the band switch accept message; and
operating the second wireless platform, by the second controller, on the second portion of the frequency band until the band switch time.

15. The computer implemented method of claim 9, further comprising:
transmitting, by the first controller, a band switch complete message to the second wireless platform, wherein the band switch complete message indicates that the first wireless platform is operating on the second portion of the frequency band.

16. The computer implemented method of claim 15, further comprising:
receiving, by a second controller of the second wireless platform, the band switch complete message;
setting, by the second controller, a second filter of the second wireless platform to operate on the first portion of the frequency band based on the band switch complete message; and
operating the second wireless platform, by the second controller, on the first portion of the frequency band in response to the second filter being set to operate on the first portion of the frequency band.

17. A non-transitory computer-readable medium having instructions stored thereon that, when executed by at least one controller of a first wireless platform operating according to a first wireless protocol on a first portion of a frequency band, cause the at least one controller to perform operations comprising:
receiving a band switch request message from a second wireless platform operating according to a second wireless protocol on a second portion of the frequency band, wherein the band switch request message comprises an indication that the second wireless platform intends to operate on the first portion of the frequency band, and a band switch delay period for the second wireless platform;
calculating a band switch time for the first wireless platform and the second wireless platform based on a band switch delay period for the first wireless platform and the band switch delay period for the second wireless platform;
transmitting a band switch accept message to the second wireless platform, wherein the band switch accept message comprises the band switch time;
setting a first filter of the first wireless platform to operate on the second portion of the frequency band based on the band switch time; and
operating the first wireless platform on the second portion of the frequency band in response to the first filter being set to operate on the second portion of the frequency band.

18. The non-transitory computer-readable medium of claim 17, the operations further comprising:
operating the first wireless platform on the first portion of the frequency band until an occurrence of the band switch time.

19. The non-transitory computer-readable medium of claim 17, wherein the calculating the band switch time comprises:
selecting a greater of the band switch delay period for the first wireless platform and the band switch delay period for the second wireless platform as the band switch time.

20. The non-transitory computer-readable medium of claim 17, wherein the setting the first filter to operate on the second portion of the frequency band comprises:
setting the first filter to operate on the second portion of the frequency band after an occurrence of the band switch time.

21. The non-transitory computer-readable medium of claim 17, wherein the operations further comprise:
transmitting a band switch complete message to the second wireless platform, wherein the band switch complete message indicates that the first wireless platform is operating on the second portion of the frequency band.

* * * * *